(12) United States Patent
Lee et al.

(10) Patent No.: US 9,985,623 B2
(45) Date of Patent: May 29, 2018

(54) PULSE AREA MODULATION METHOD AND PULSE AREA MODULATOR USING THEREOF

(71) Applicant: RADSONE INC., Seongnam-si, Gyeonggi-do (KR)

(72) Inventors: Woo Suk Lee, Seoul (KR); Chul Jae Yoo, Seongnam-si (KR)

(73) Assignee: RADSONE INC., Seongnam-si, Gyeonggi-do (KR)

( * ) Notice: Subject to any disclaimer, the term of this patent is extended or adjusted under 35 U.S.C. 154(b) by 418 days.

(21) Appl. No.: 14/970,885

(22) Filed: Dec. 16, 2015

(65) Prior Publication Data

US 2016/0182030 A1    Jun. 23, 2016

(30) Foreign Application Priority Data

Dec. 17, 2014 (KR) .......................... 10-2014-0182571

(51) Int. Cl.
*H03K 7/02* (2006.01)

(52) U.S. Cl.
CPC ..................................... *H03K 7/02* (2013.01)

(58) Field of Classification Search
CPC ........................................................ H03K 7/02
USPC ............................................................ 332/108
See application file for complete search history.

(56) References Cited

U.S. PATENT DOCUMENTS

| | | | | |
|---|---|---|---|---|
| 3,789,393 A | * | 1/1974 | Tripp | ...................... G01D 5/208 318/599 |
| 2004/0207465 A1 | * | 10/2004 | Nilsson | .................. H03F 3/2175 330/10 |
| 2009/0273396 A1 | * | 11/2009 | Nam | ....................... H03F 3/217 330/10 |

* cited by examiner

*Primary Examiner* — Jeffrey Shin
(74) *Attorney, Agent, or Firm* — Paratus Law Group, PLLC (57) ABSTRACT

Provided is a pulse area modulation apparatus including: a register configured to receive and store PCM data having n+m bits per a sample; an amplitude shaping unit configured to shape an amplitude of an output pulse to correspond to the n bits; a duration forming unit configured to form duration of the output pulse to correspond to the m bits; and a charge accumulation means providing an output pulse, wherein a pulse area of the output pulse defined by the amplitude and the duration is modulated according to the sample.

17 Claims, 7 Drawing Sheets

PULSE AREA MODULATION METHOD AND PULSE AREA MODULATOR USING THEREOF

CROSS-REFERENCE TO RELATED APPLICATIONS

This application claims the priority of Korean Patent Application No. 10-2014-0182571 filed on Dec. 17, 2014, in the Korean Intellectual Property Office, the disclosure of which is incorporated herein by reference.

BACKGROUND

Field

The following description relates to a pulse area modulation method and a pulse area modulator using thereof.

Description of the Related Art

According to a pulse code modulation (PCM) scheme, consecutive analog signals are sampled at a predetermined frequency and respective samples are quantized. The quantized samples are coded by a predetermined coding method and converted into binary digital data.

SUMMARY

As one example, when modulating 16-bit PCM modulated samples using pulse width modulation PWM scheme, a period of pulse could be controlled in $2^{16}$ steps. When the PCM samples are sampled at a sampling frequency of 48 KHz, an input/output (I/O) clock having frequency of 48 KHz×$2^{16}$≈3.1457 GHz is theoretically required. However, it is actually difficult to implement the clock having the frequency.

In order to modulate samples with PWM using a input/output clock having lower frequency, a number of bits per sample of an original sample should be decreased. And oversampling and noise shaping should be performed to push quantization noise out of an interesting bandwidth.

However, the noise out of the interesting bandwidth affects signal and/or minute properties in the interesting bandwidth and exert a large influence on overall performance of digital-analog conversion.

The following technology has been designed to omit a noise shaping process and propose a new high-performance modulation method. That is, the following technology is to provide a modulation method and a modulator using the same, which does not generate quantization noise due to the noise shaping because the noise shaping is not performed and needs not decrease a bit resolution. Further, the following technology has been designed to provide a modulation method that can increase resolution of digital-analog conversion while maintaining an input/output clock used during a digital-analog conversion process as it is regardless of the noise shaping.

In one general aspect, there is provided a pulse area modulation apparatus including: a register configured to receive and store PCM data having n+m bits per a sample; an amplitude shaping unit configured to shape an amplitude of an output pulse to correspond to the n bits; and a duration forming unit configured to form duration of the output pulse to correspond to the m bits, wherein an area of the output pulse defined by the amplitude and the duration is modulated according to the sample.

In another aspect, there is provided a pulse area modulation method including: (a) receiving PCM data having n+m bits per a sample; (b) shaping an amplitude of an output pulse corresponding to the n bits; and (c) outputting a pulse having duration corresponding to the m bits, wherein an area of the pulse defined by the amplitude and the duration is modulated according to the sample.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE PREFERRED EMBODIMENT

Exemplary embodiments of the present disclosure will now be described in detail with reference to the accompanying drawings.

Since description of the present disclosure is just an exemplary embodiment for structural or functional description, it should not be analyzed that the scope of the present disclosure is limited by the exemplary embodiment described in the specification. That is, since the exemplary embodiment can be variously changed and have various forms, it should be appreciated that the scope of the present disclosure includes equivalents to implement the technical spirit.

Meanwhile, meanings of terms described in the present application should be appreciated as follows.

The terms "first," "second,", and the like are used to differentiate a certain component from other components, but the scope of should not be construed to be limited by the terms. For example, a first component may be referred to as a second component, and similarly, a second component may be referred to as a first component.

It should be understood that, when it is described that an element is "above" or "on" another element, the element may be "directly on" another element or a third element may be present therebetween. In contrast, it should be understood that, when it is described that an element "contacts" another element, it is understood that no element is present between the element and another element. Meanwhile, other expressions describing the relationship of the components, that is, "intervening" and "directly intervening", "between" and "directly between" or "adjacent to" and "directly adjacent to" should be similarly analyzed.

It should be appreciated that a single expression does not include a plurality of expressions if the single expression does not clearly mean contextually different expressions and it should be understood that term "include" indicates that a feature, a number, a step, an operation, a component, a part or the combination thereof which are implemented are present, but does not exclude a possibility of presence or addition of one or more other features, numbers, steps, operations, components, parts or combinations, in advance.

The respective steps may be performed differently from an order which is specified if a specific order is not described contextually clearly. That is, the respective steps may be performed similarly to the specified order, performed substantially simultaneously, and performed in an opposite order.

In drawings referred for describing exemplary embodiments of the present disclosure, a size, a height, a thickness, and the like are intentionally exaggerated and expressed for easy description and easiness of understanding and are not enlarged or reduced. Further, any component illustrated in the drawings is intentionally reduced and expressed and another component can be intentionally enlarged and expressed.

If it is not contrarily defined, all terms used herein have the same meaning as those generally understood by a person with ordinary skill in the art. Terms which are defined in a generally used dictionary should be interpreted to have the same meaning as the meaning in the context of the related art, and are not interpreted as an ideally or excessively formal meaning unless clearly defined in the present disclosure.

Figure 1:
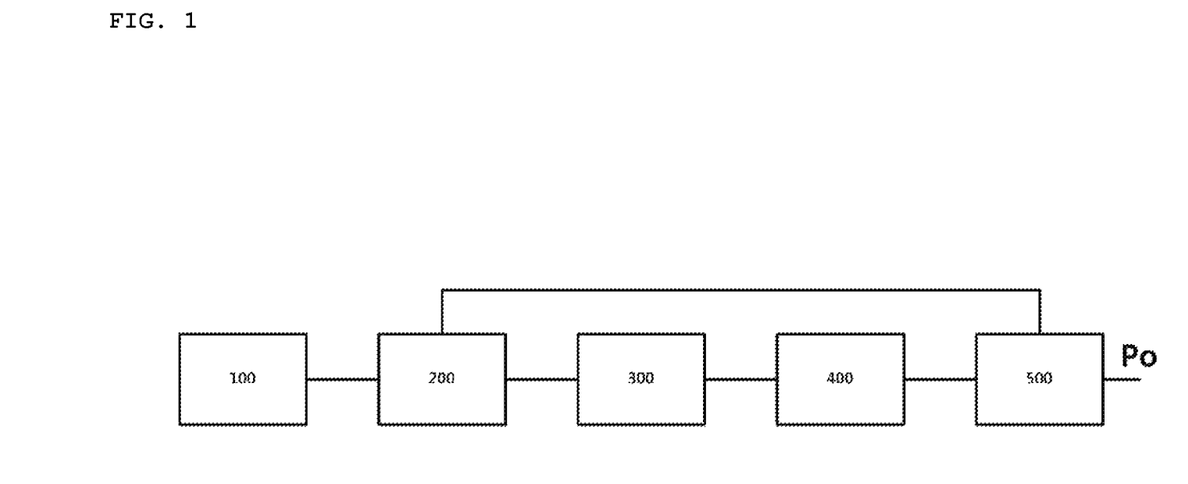
FIG. 1 is a block diagram illustrating an outline of a pulse area modulator according to an exemplary embodiment.

Hereinafter, a pulse area modulator according to an exemplary embodiment of the present disclosure will be described with reference to the accompanying drawings. FIG. 1 is a block diagram illustrating an outline of a pulse area modulator according to an exemplary embodiment.

Referring to FIG. 1, a pulse area modulation apparatus according to an exemplary embodiment includes a PCM modulator 100, a register 200, an amplitude shaping unit 300, a charge accumulation means 400, and a duration forming unit 500.

The PCM modulator 100 provides binary PCM data including at least one sample. The samples included in the binary PCM data may have n+m bits per a sample. As described below, n bits may correspond to an amplitude of an output pulse in one sample and m bits may correspond to duration of the output pulse. Further, both n and m are natural numbers and may be the same as or different from each other according to an implementation example.

As one example, when one sample s1 is a total of 16 bits as s1 [0:15], 8 bits of s1 [0:7] are modulated, and as a result, the amplitude of the output pulse corresponding thereto may be formed and s1 [8:15] may be modulated to correspond to the duration of the output pulse. As another example, when a sample s2 is a total of 18 bits as s2 [0:17], 9 bits of s2 [0:8] may correspond to the duration of the output pulse and s2 [9:17] may be modulated to correspond to the amplitude of the output pulse. As yet another example, when a sample s3 is a total of 18 bits as s3 [0:17], 10 bits of s3 [0:9] may correspond to the amplitude of the output pulse and 8 bits of s0 [10:17] may be modulated to correspond to the duration of the output pulse.

The register 200 stores the binary PCM data provided by the PCM modulator 100. As one example, the register 200 is implemented by a pipeline register, and as a result, the pulse area modulation apparatus may be implemented by a pipeline scheme.

The amplitude shaping unit 300 accumulates charges in the charge accumulation means 400 and shapes an amplitude of an output pulse Po to correspond to n bits. The charge accumulation means 400 accumulates the charges to form the amplitude of the output pulse Po. The duration forming unit 500 discharges the charge accumulation means 400 during a time corresponding to m bits to form duration of the output pulse Po.

Figure 2:
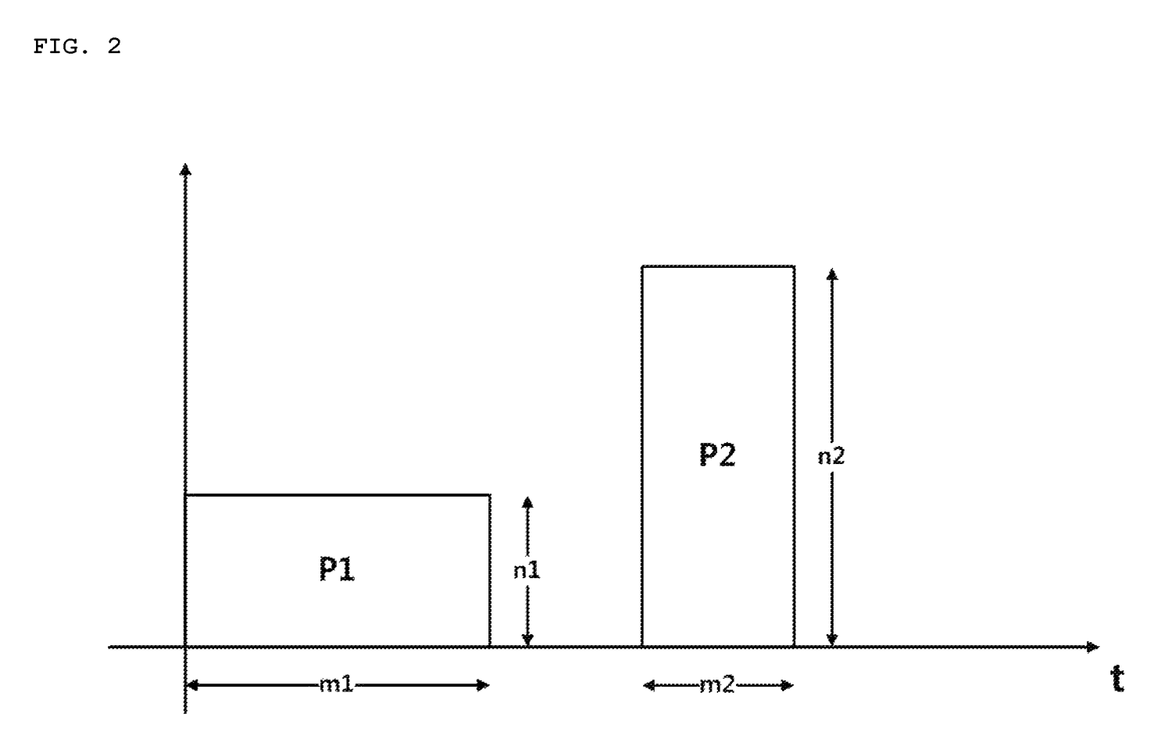
FIG. 2 is a diagram illustrating an outline of a pulse of which an area is modulated according to the exemplary embodiment.

An example of the output pulse formed as such is illustrated in FIG. 2. When the sample s1 have n1+m1 bits and the sample s2 have n2+m2 bits, a pulse P1 modulated according to the sample s1 has an amplitude formed to correspond to n1 bits and duration formed to correspond to m1 bits. Similarly, a pulse P2 modulated by the sample s2 has an amplitude formed to correspond to n2 bits and duration formed to correspond to m2 bits. Accordingly, it can be seen that the pulse modulated according to the exemplary embodiment, in which an area defined by the amplitude and the duration is modulated according to the sample.

Figure 3:
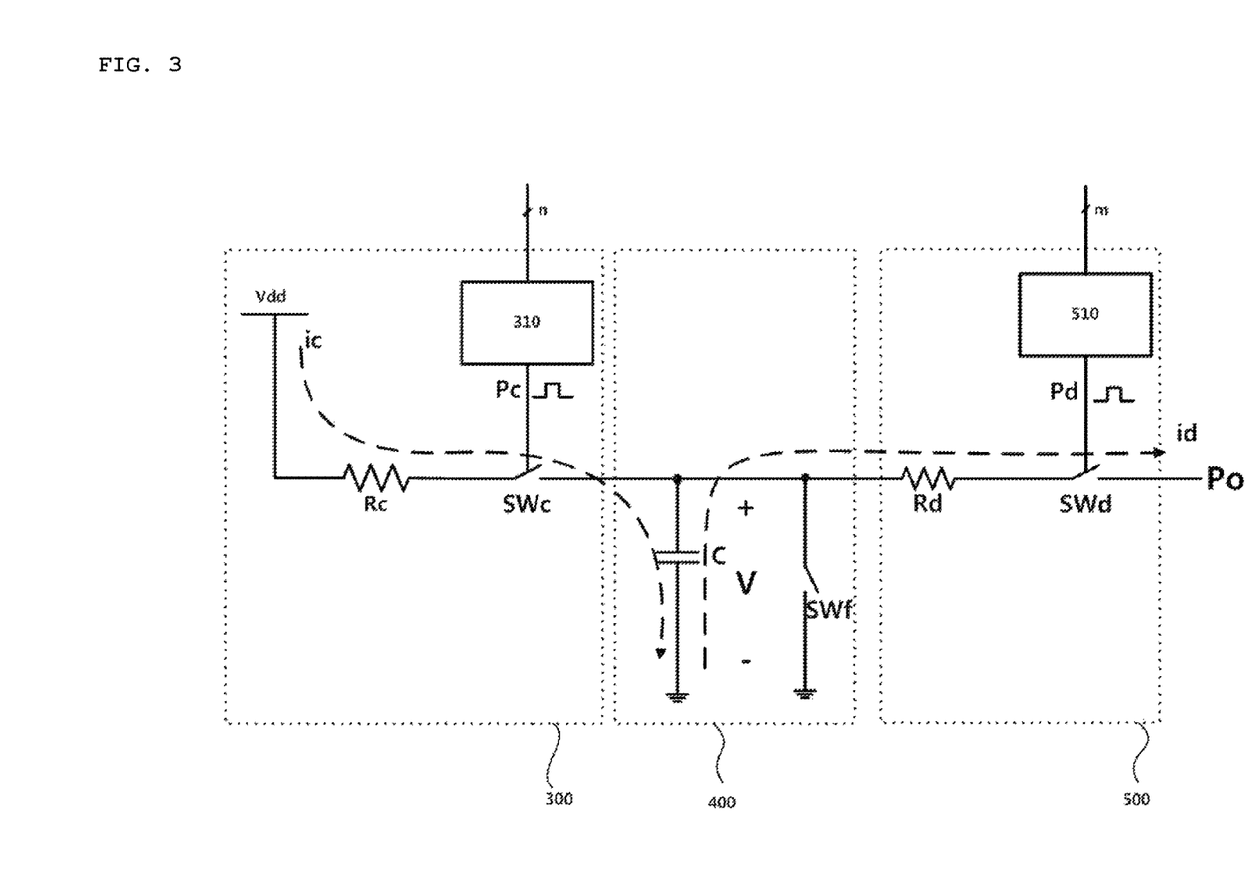
FIG. 3 is an outline diagram for describing an amplitude shaping unit, a charge accumulation means, and a duration forming unit.

FIG. 3 is an outline diagram for describing an amplitude shaping unit 300, a charge accumulation means 400, and a duration forming unit 500. Referring to FIG. 3, the amplitude shaping unit 300 includes a first pulse width modulation device 310, and a charging switch SWc. Rc illustrated in FIG. 3 may a parasitic resistance of the path from the power supply Vdd to the charge accumulation means 400 and/or a resistance for controlling a time constant with the charge accumulation means 400.

The charging switch SWc may be implemented by an element whose conduction between one end and the other end is controlled by an electric signal applied to a control electrode. As one example, the charging switch SWc may be implemented by a metal oxide semiconductor field effect transistor (MOS FET) whose conduction between source and a drain is controlled by a voltage signal applied to a gate. As another example, the charging switch SWc may be implemented by a Bipolar Junction Transistor (BJT) whose conduction between an emitter and a collector is controlled by a current signal applied to a base.

The first pulse width modulation device 310 receives data of n bits and forms a charge control pulse Pc corresponding to the n bits. The first pulse width modulation device 310 provides the charge control pulse Pc to the control electrode of the charging switch SWc to control the charging switch SWc to modulate the amplitude of the output pulse.

When the charging switch SWc is closed by the charge control pulse Pc, current is flows to a capacitor C included in the charge accumulation means 400 from the power supply Vdd through the resistance Rc. The charging switch SWC is closed for a target time, and as a result, target voltage is formed at the capacitor included in the charge accumulation means 400.

Figure 4A:
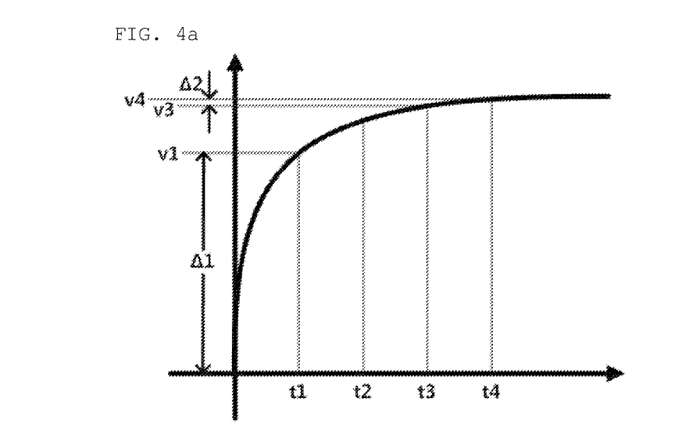
FIG. 4*a* is a diagram illustrating a change of voltage V formed on both ends of the charge accumulation means with time.

As one example, since the voltage V of the capacitor during a charging process illustrated in FIG. 4a exponentially increases up to a power supply voltage value as time elapses, $\Delta 2$ has lower value than value of $\Delta 1$ as a number of bit increases (where $\Delta 1$ is a voltage difference between 0 and v1 and $\Delta 2$ is a voltage difference between v3 and v4). Thus, it may be difficult to distinguish between adjacent voltages.

Figure 4B:
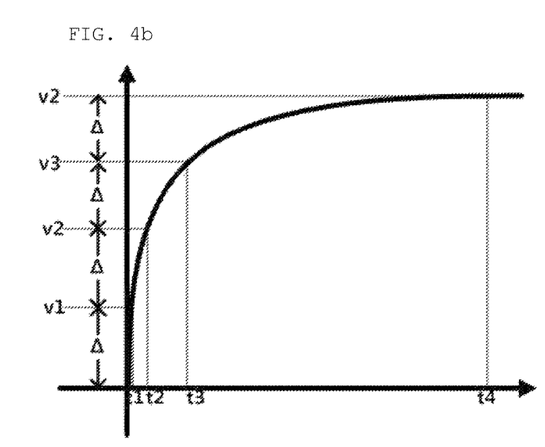
FIG. 4*b* is a diagram for describing charge time calibration.

In an exemplary embodiment, the first pulse width modulation device 310 controls a charging time so that $\Delta$, difference between the adjacent voltage values, is constant with each other by performing calibration with respect to the charge time in order to secure sufficient resolution as illustrated in FIG. 4b. The calibration may be performed by calculating a time to perform charging by using the n-bit data provided to the first pulse width modulation device 310. As another example, a charge time corresponding to n bits may be acquired by using a look up table stored in a memory (not illustrated).

Figure 4C:
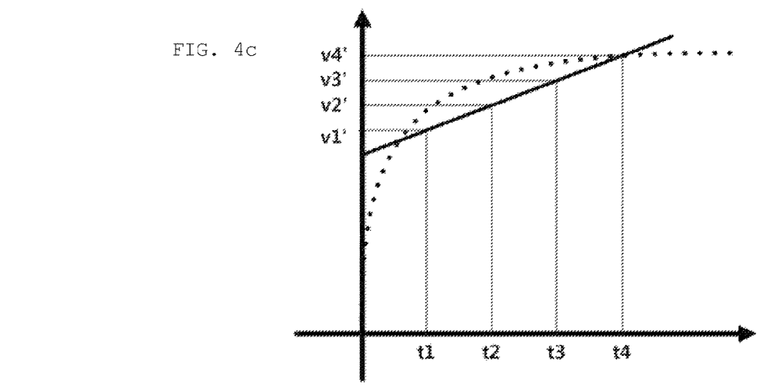
FIG. 4*c* is a diagram illustrating a case in which V is approximated to be linearly changed.

In another exemplary embodiment, referring to FIG. 4c, as the current is provided to the charge accumulation means 400 and the voltage V formed at the charge accumulation means 400 changes exponentially time. But ic and V may be approximated to be linearly changed for a sufficient time. The change of the voltage which is linearly approximated is illustrated in FIG. 4c. Accordingly, when the n-bit data corresponds to a charge time from 0 to t3, the first pulse width modulation device 310 forms a charge control pulse to close the charging switch SWc from 0 to t3 and provides the formed charge control pulse to the control electrode of the charging switch.

n bits may have information on voltage formed in the charge accumulation means 400, the first pulse width modulation device 310 may acquire the charge time by the look up table or performing calculation, and forms the charge control pulse corresponding to the acquired charge time and provide the formed charge control pulse to the charging switch. Further, n bits may have information on the charge time and the first pulse width modulation device 310 may form the charge control pulse having a pulse width corresponding to the charge time and provide the formed charge control pulse to the charging switch.

The duration forming unit 500 forms the output pulse Po having duration corresponds to m bits provided from the register 200 (see FIG. 1). A second pulse width modulation device 510 forms a duration control pulse Pd having a pulse width corresponding to data of m bits. The second pulse width modulation device 510 provides the formed duration control pulse Pd to a control electrode of an output switch SWd and controls the output switch SWd. Since the output switch SWd is controlled to correspond to the pulse width of the duration control pulse Pd, the duration of the output pulse Po corresponds to the pulse width of the duration control pulse Pd.

During discharging, the voltage V of the charge accumulation means also decreases corresponding to a time constant of Rd×C, where Rd is an output resistance value that exists on a discharging path and C is a capacitance value of the equivalent capacitor of the charge accumulation means. The resistance value of Rd is increased sufficient to maintain output voltage during outputting the output pulse Po by suppressing discharge of the capacitor C included in the charge accumulation means 400.

When the output pulse Po is provided to external resistance (not illustrated) having a larger resistance value than the output resistance Rd, the duration forming unit 500 may be configured without using the output resistance Rd. As one example, the output resistance Rd may have a resistance value of several MΩ to hundreds of MΩ, and as a result, the output pulse output by the pulse area modulation apparatus has a pseudo rectangular pulse form.

In an exemplary embodiment, since the charges may remain in the capacitor C even after the processing of outputting the output pulse Po cause an error in forming target voltage in a capacitor c. Thus, flush switch SWf is closed to flush the charges which remain in the capacitor to a ground. The voltage V of the capacitor returns to 0 after the flushing.

As described above, when a sample with n+m bits are provided, the amplitude of modulated output pulse Po corresponds to the n bits and the duration of the output pulse Po corresponds to the m bits of the sample. As a result, the sample of n+m bits are modulated with an area of pulse illustrated in a time axis and an amplitude axis to be transmitted and received.

Figure 5:
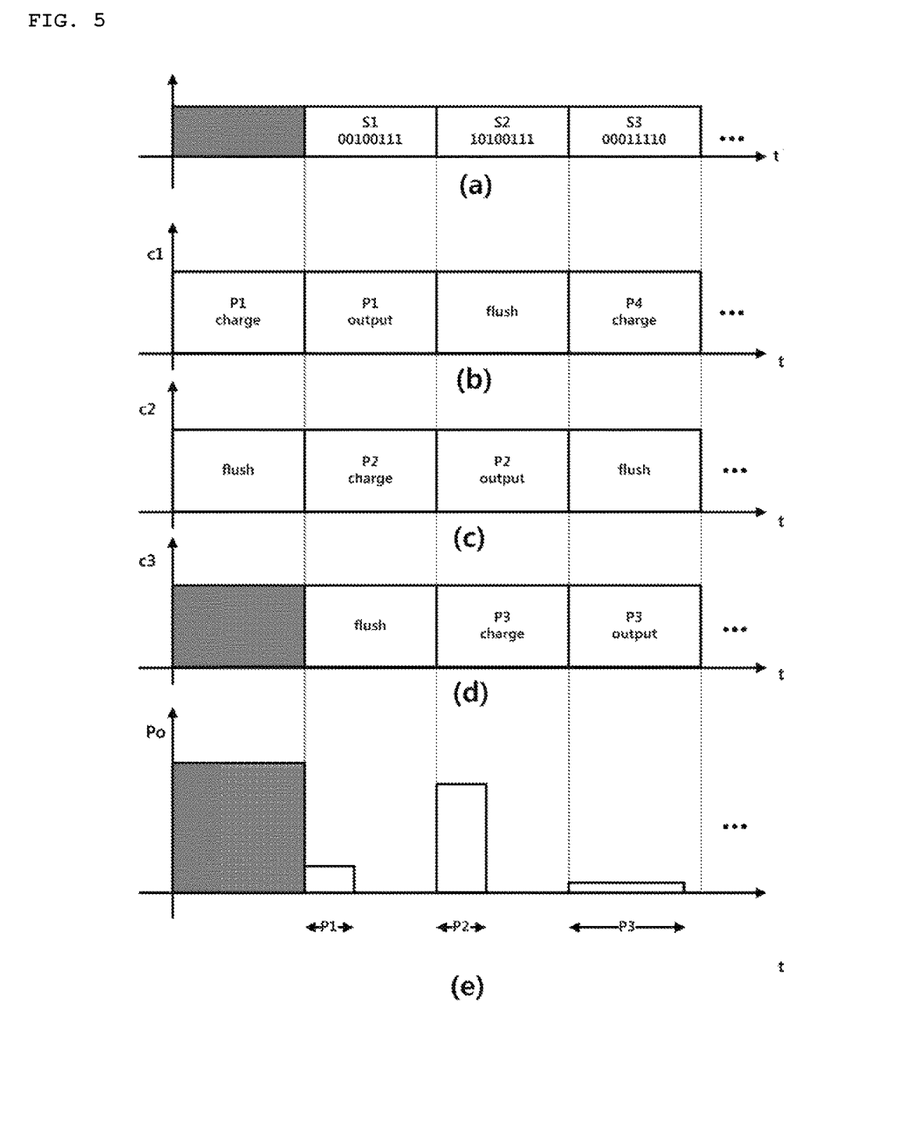
FIG. 5 is an outline diagram illustrating a pulse area modulation method and an example in which the pulse area modulation apparatus is driven in a pipeline scheme according to the exemplary embodiment.

FIG. 5 is an outline diagram illustrating a pulse area modulation method and an example in which the pulse area modulation apparatus is driven in a pipeline scheme according to the exemplary embodiment. FIG. 5a is a diagram illustrating samples S1, S2, S3, S4, and the like of PCM data sequentially stored in the pipeline register 200 and FIGS. 5b to 5d are outline diagrams illustrating operations of respective capacitors c1, c2, and c3 when the pulse area modulation apparatus is driven through a pipeline by using three capacitors. FIG. 5e is an outline diagram illustrating the output pulse Po output by the pulse area modulation apparatus.

Referring to FIGS. 5a to 5d, capacitor c1 is charged (P1 charge) so that voltage formed in the capacitor c1 corresponds to n bits of a P1 sample stored in the pipeline register. The voltage formed in the capacitor c1 is output with the duration corresponding to m bits of the P1 sample to form an output pulse P1 (P1 output).

When the charges remain in the capacitor c1 are not flushed, an error occurs. The capacitor c1 is flushed to return the voltage of the capacitor to 0. That is, the capacitor c1 continuously performs a cycle of charge, output, and flush.

The capacitor c2 is flushed while c1 is in charging. Thereafter, c2 is charged in order to form the output pulse by the next sample P2 when c1 outputs P1. Subsequently, c2 outputs the output pulse P2 modulated by sample P2 while c1 is in flushing. And thereafter, c2 is flushed. The capacitor c3 also is flushed when c2 is in charging and repeatedly performs charging, outputting, and flushing steps according to the sample in sequence.

As illustrated in FIG. 5, the pulse area modulation apparatus is driven in the pipeline scheme by using the pipeline register and the plurality of capacitors to improve driving efficiency.

Figure 6:
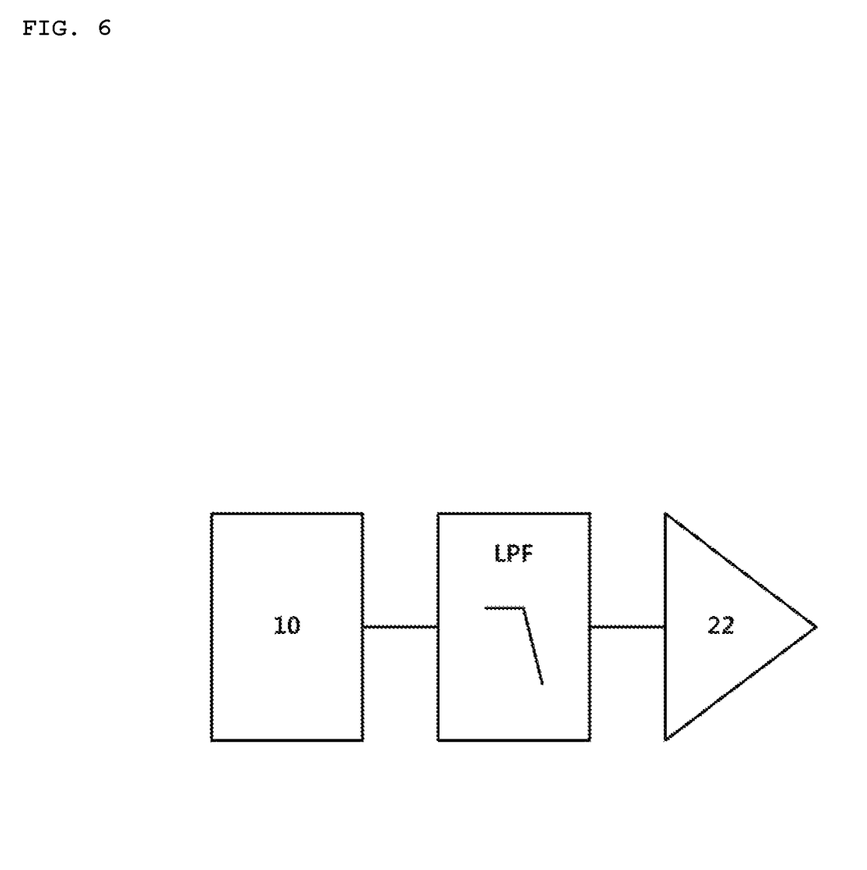
FIG. 6 is a diagram illustrating an example of implementing a digital analog converter (DAC) by using the pulse area modulator according to the exemplary embodiment of the present disclosure.

FIG. 6 is a diagram illustrating an example of implementing a digital analog converter (DAC) by using the pulse area modulator according to the exemplary embodiment of the present disclosure. Referring to FIG. 6, according to the exemplary embodiment, a output from the pulse area modulator 10 is provided to a low pass filter LPF. The low pass filtered signal is provided to a power amplifier 22 and power amplifier 22 forms an analog output signal having predetermined power.

Figure 7:
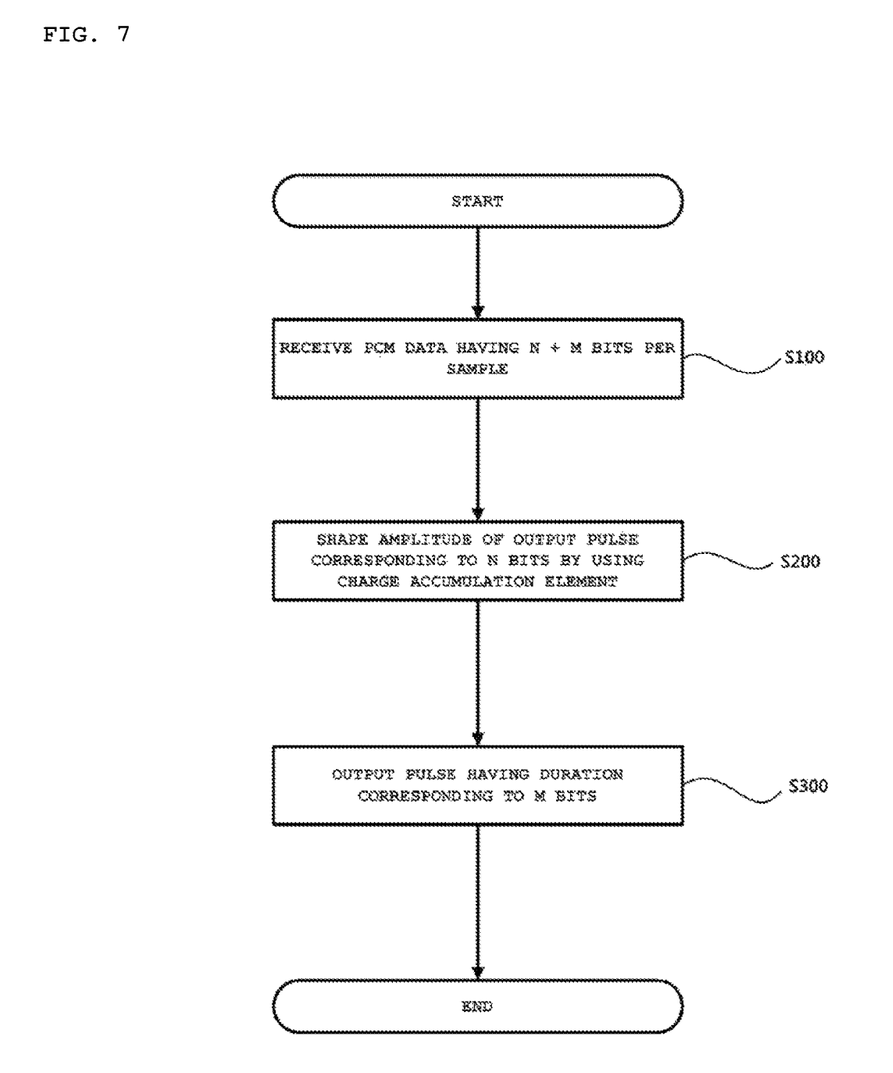
FIG. 7 is a flowchart illustrating an outline of a pulse area modulation method according to an exemplary embodiment.

FIG. 7 is a flowchart illustrating an outline of a pulse area modulation method according to an exemplary embodiment and hereinafter, an outline of the pulse area modulation method according to the exemplary embodiment will be described with reference to FIG. 7. However, for simple and clear description, description of a duplicated part with the exemplary embodiment described above may be omitted. The pulse area modulation method according to the exemplary embodiment includes receiving PCM data having n+m bits per a unit sample, forming an amplitude of an output pulse corresponding to the n bits by using a charge accumulation means, and outputting a pulse having duration corresponding to the m bits and an area of a pulse defined by the amplitude and the duration is modulated according to the sample.

The receiving of the PCM data having the n+m bits per a sample may be performed by providing binary PCM data including a plurality of samples to the register 200 (see FIG. 1) by the PCM modulator 100 (see FIG. 1).

The forming of the amplitude of the output pulse corresponding to the n bits by using the charge accumulation means 400 (see FIG. 3) is performed by controlling the charging switch SWc (see FIG. 3) by providing the charge control pulse Pc (see FIG. 3) by the first pulse width control device 310 (see FIG. 3) so as to form voltage corresponding to the n bits.

The outputting of the pulse having the duration corresponding to the m bits may be performed by providing the duration control pulse Pd (see FIG. 3) having the pulse width corresponding to the m bits and controlling the output switch SWd with the duration control pulse by the second pulse width control device 510 (see FIG. 3).

Further, the pulse area modulation method according to the exemplary embodiment may be implemented through the pipeline scheme by using the plurality of charge accumulation means and the pipe line register.

As set forth above, according to exemplary embodiment of the following description, bit resolution needs not be decreased and noise shaping is not performed, and as a result, additional quantization noise is not formed. Further, resolution of digital-analog conversion can be improved while not increasing an input/output clock frequency used during a digital-analog conversion process.

While the present disclosure has been illustrated and described in connection with the exemplary embodiments, it will be apparent to those skilled in the art that modifications and variations can be made without departing from the spirit and scope of the disclosure as defined by the appended claims.

What is claimed is:

1. A pulse area modulation apparatus comprising:
    a register configured to receive and store PCM data having n+m bits per a sample;
    a charge accumulation means;
    an amplitude shaping unit configured to shape an amplitude of an output pulse corresponding to the n bits by accumulating charges in the charge accumulation means; and
    a duration forming unit configured to form and output duration of the output pulse to correspond to the m bits,
    wherein a pulse area of the output pulse defined by the amplitude and the duration is modulated according to the sample (n and m are natural numbers).

2. The pulse area modulation apparatus of claim 1, wherein the register is a pipeline register sequentially storing provided samples.

3. The pulse area modulation apparatus of claim 1, wherein the amplitude shaping unit forms voltage corresponding to the n bits in the charge accumulation means.

4. The pulse area modulation apparatus of claim 1, wherein:
    the amplitude shaping unit includes
    a power supply which provides current, and
    a first pulse width modulation device configured to form a charge control pulse having charge time information corresponding to the n bits, and
    a charging switch configured to conduct current to the charge accumulation means, wherein a conduction of the charging switch is controlled by the charge control pulse.

5. The pulse area modulation apparatus of claim 4, wherein the first pulse width modulation device further performs calibration for a charge time.

6. The pulse area modulation apparatus of claim 1, wherein:
    the duration forming unit includes
    a second pulse width modulation device configured to form a duration control pulse having duration information corresponding to the m bits, and
    an output switch configured to provide the output pulse having duration according to the m bits,
    wherein a conduction of the output switch is controlled by the duration control pulse.

7. The pulse area modulation apparatus of claim 6, wherein:
    the duration forming unit further comprises
    a output resistor,
    wherein one end of the output resistor is electrically connected to the charge accumulation means and the other end thereof is connected to the output switch.

8. The pulse area modulation apparatus of claim 1, further comprising:
    a flushing path configured to flush the charges accumulated in the charge accumulation means.

9. The pulse area modulation apparatus of claim 1,
    wherein the pulse area modulation apparatus includes a plurality of charge accumulation means, and
    the amplitude shaping unit, the duration forming unit, and the plurality of charge accumulation means operate in a pipe line scheme.

10. A pulse area modulation method comprising steps of:
    (a) receiving PCM data having n+m bits per a sample;
    (b) shaping an amplitude of an output pulse corresponding to the n bits; and
    (c) outputting a pulse having duration corresponding to the m bits,
    wherein an area of the pulse defined by the amplitude and the duration is modulated according to the sample (n and m are natural numbers).

11. The pulse area modulation method of claim 10, wherein the step (a) is performed by sequentially storing samples in a pipeline register.

12. The pulse area modulation method of claim 10, wherein the step (b) is performed by accumulating charges so as to form voltage corresponding to the n bits in a charge accumulation means.

13. The pulse area modulation method of claim 10, wherein the step (b) comprises:
    (b1) forming a charge control pulse having a pulse width corresponding to the n bits by performing pulse width modulation; and
    (b2) forming target voltage by accumulating the charges in the charge accumulation means by applying the charge control pulse to a charging switch.

14. The pulse area modulation method of claim 13, wherein before the step (b1),
    calibration for a charge time is further performed.

15. The pulse area modulation method of claim 10, wherein:
    The step (c) comprises
    (c1) forming the output pulse having the pulse width corresponding to the m bits by performing the pulse width modulation; and
    (c2) outputting a pulse for duration corresponding to the m bits by applying the output pulse to an output switch.

16. The pulse area modulation method of claim 10, further comprising:
    (d) flushing the charges accumulated in the charge accumulation means after the outputting of the pulse.

17. The pulse area modulation method of claim 10, wherein the (b) to (d) are performed in a pipeline scheme by using a plurality of charge accumulation means.

\* \* \* \* \*